(12) United States Patent
Zhou et al.

(10) Patent No.: US 8,957,409 B2
(45) Date of Patent: Feb. 17, 2015

(54) DOUBLE-SIDED LUMINESCENT ORGANIC LIGHT EMITTING DEVICE AND MANUFACTURING METHOD THEREOF

(75) Inventors: Mingjie Zhou, Guangdong (CN); Ping Wang, Guangdong (CN); Xiaoming Feng, Guangdong (CN); Tietao Zhong, Guangdong (CN)

(73) Assignee: Ocean's King Lighting Science & Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/885,494

(22) PCT Filed: Dec. 9, 2010

(86) PCT No.: PCT/CN2010/079634
§ 371 (c)(1),
(2), (4) Date: May 15, 2013

(87) PCT Pub. No.: WO2012/075639
PCT Pub. Date: Jun. 14, 2012

(65) Prior Publication Data
US 2013/0228769 A1   Sep. 5, 2013

(51) Int. Cl.
*H01L 51/50*   (2006.01)
*H01L 51/52*   (2006.01)
*H01L 51/00*   (2006.01)

(52) U.S. Cl.
CPC ........ *H01L 51/5012* (2013.01); *H01L 51/5278* (2013.01); *H01L 2251/5323* (2013.01); *H01L 51/0081* (2013.01)
USPC ........................................................ 257/40

(58) Field of Classification Search
CPC .................. H01L 2251/5323; H01L 27/3267; H01L 27/3209; H01L 51/5262; H01L 27/3286; H01L 25/048
USPC ................. 257/40, 59, 72, 88, 89; 438/29, 34
See application file for complete search history.

(56) References Cited

U.S. PATENT DOCUMENTS

| | | |
|---|---|---|
| 2007/0103066 A1 | 5/2007 | D'Andrade et al. |
| 2008/0001143 A1* | 1/2008 | Nomura et al. ............... 257/40 |

(Continued)

FOREIGN PATENT DOCUMENTS

| | | |
|---|---|---|
| CN | 1688185 | 10/2005 |
| CN | 1901218 | 1/2007 |

(Continued)

OTHER PUBLICATIONS

International Search Report of PCT/CN2010/079634 dated Sep. 15, 2011.

*Primary Examiner* — Whitney T Moore
(74) *Attorney, Agent, or Firm* — Rankin, Hill & Clark LLP

(57) ABSTRACT

Disclosed are a double-sided luminescent organic light emitting device and the manufacturing method thereof. The double-sided luminescent organic light emitting device comprises a transparent substrate (21), an anode (22), a transparent cathode (25), and at least two organic light emitting structures (23a, 23b) and at least a charge-generation layer (24) set between the anode (22) and the transparent cathode (25), and the charge-generation layer (24) is set between the two neighboring organic light emitting structures (23a, 23b), the charge-generation layer (24) and the organic light emitting structures (23a, 23b) are alternately arranged. The charge-generation layer (24) includes an n-type semiconductor layer (241) and a p-type semiconductor (242) layer combined with the n-type semiconductor layer. Said double-sided light emitting organic light emitting device requires low driving current, and has high luminescence efficiency, high brightness, and high light extraction efficiency. In addition, said device enables nearly 360 degrees omnidirectional illumination, enlarges the illumination area and the application range, and has long lifetime, simple preparation procedures and low production cost.

14 Claims, 5 Drawing Sheets

(56) References Cited

U.S. PATENT DOCUMENTS

2009/0050882 A1* 2/2009 Okuyama et al. ............... 257/40
2009/0230415 A1* 9/2009 Ide et al. ......................... 257/98
2009/0243477 A1* 10/2009 Saneto et al. ................. 313/504
2010/0308353 A1* 12/2010 Grabowski et al. ............. 257/89

FOREIGN PATENT DOCUMENTS

CN 1979915 6/2007
WO 2009/104148 8/2009

* cited by examiner

DOUBLE-SIDED LUMINESCENT ORGANIC LIGHT EMITTING DEVICE AND MANUFACTURING METHOD THEREOF

TECHNICAL FIELD

The present invention relates to the field of electric light source, and more specifically, to a double-sided light emitting organic electroluminescent device and the manufacturing method thereof.

BACKGROUND

The electric light industry has always been a research hotspot attracts many researchers to study on competing all over the world, and it has a very important position in the world economy. Nowadays the gas discharge light source is widely employed, and the principle of such light source is that the inner space of the lamp is evacuated prior to being fulfilled with mixed gas containing mercury, and the light is generated by means of gas discharge or emitted from the phosphor powder under the stimulation of the ultraviolet generated by the gas discharge. However, the pulsed light of gas discharge light source can easily lead to visual fatigue, and the mercury can pollute the environment. With the development of the society and the advancement of technology, it is important to research and development of energy-saving and environmental friendly, green light sources to replace traditional light sources, and it has been an important issue for the researchers to study on competing in all countries.

The organic electroluminescent device is one of the electric light sources. The organic light emission diode (OLED for short) has the properties of high brightness, wide range of material selection, low drive voltage, solid state active light-emission and the like, and also has the advantages of high definition, wide viewing angle, fast response and the like, meanwhile the OLED has excellent flexibility, thus it can be folded or bent, so it is a light source with much potential for the flexible display technology, and the development thereof is in line with the trends of the mobile communication and information display in the information age, and meets the requirement of the green lighting technology, accordingly it is currently a research focus for the researchers to study at home and abroad.

The organic electroluminescent device has a sandwich-like structure, which substantially includes an anode, an organic electroluminescent structure and a cathode, wherein the organic electroluminescent structure comprises at least one selected from the group consisting of a hole injection layer and a hole transport layer, and a light emitting layer, as well as at least one selected from the group consisting of an electron transport layer and an electron injection layer. FIG. 1 shows the structural schematic diagram of an organic electroluminescent device including all of these structures in prior art, this device comprises a transparent substrate 11 and an anode 12, an organic electroluminescent structure 13 and a cathode 14 sequentially arranged on the transparent substrate 11 and conjugated together. Wherein the organic electroluminescent structure 13 includes a hole injection layer 131, a hole transport layer 132, a light emitting layer 133, an electron transport layer 134, and an electron injection layer 135.

Up to now, researchers all over the world have improved the indicators of the device performance by selecting suitable organic materials and reasonable device structure designs, but due to the heavy driving current, low luminous efficiency, short lifetime of the light emitting device, it is desired to develop a light emitting device with small driving current, and high luminous efficiency, in order to achieve the practical use of the organic electroluminescent device.

Furthermore, the OLED in prior art can only emit light from one side of the anode or the cathode, as a result the OLED can only be the style of bottom emission or top emission. Some researchers have invented a double-sided light emitting or display OLED device with double-layer structure design, i.e. two sets of OLED light emitting or display units are combined together by means of "back to back" to achieve the double-sided light emitting or display. This kind of structure makes the configuration of the OLED device more complicated, and increases the thickness and weight thereof, and the cost is significantly increased.

SUMMARY

The technical problem to be dissolved by the present invention is to overcome the above-discussed deficiencies in prior art, and to provide a double-sided light emitting organic electroluminescent device with small driving current, high brightness, high current efficiency, furthermore, a manufacture method of the organic electroluminescent device is also provided.

The technical problems of the present invention can be solved through the following technical solutions:

a double-sided light emitting organic electroluminescent device, which includes a light-transmissive substrate, an anode, a light-transmissive cathode, and there are at least two organic electroluminescent structures and at least one charge generation layer arranged between the anode and the light-transmissive cathode;

wherein the charge generation layer is sandwiched between the two neighboring organic electroluminescent structures and conjugated thereto, and the charge generation layer and the organic electroluminescent structure are alternatively arranged and combined together;

the charge generation layer includes an N-type semiconductor layer and a P-type semiconductor layer combined with the N-type semiconductor.

And, a method for manufacturing the double-sided light emitting organic electroluminescent device, which comprises:

providing a light-transmissive substrate;

plating an anode on one surface of the light-transmissive substrate;

plating at least two organic electroluminescent structures and at least one charge generation layer on the surface of the anode opposite to the light-transmissive substrate, wherein the charge generation layer is disposed between the two neighboring organic electroluminescent structures and conjugated thereto, the charge generation layer and the organic electroluminescent structures are alternately arranged, the charge generation layer includes an N-type semiconductor layer and a P-type semiconductor layer combined with the N-type semiconductor, plating a light-transmissive cathode at last to obtain the organic electroluminescent device.

The double-sided light emitting organic electroluminescent device according to the present invention has a charge generation layer connected with two or more organic electroluminescent structures, so as to allow the double-sided light emitting organic electroluminescent device to illuminate nearly 360° omnidirectionally, which enlarges the illumination area and the application range. The double-sided light emitting organic electroluminescent device with this configuration has small driving current, high luminous efficiency, high brightness, and high light output efficiency.

Meanwhile, due to the small driving current, the lifetime of the double-sided light emitting organic electroluminescent device is significantly increased. The method of producing the double-sided light emitting organic electroluminescent device may be carried out by simply plating each layer sequentially, which has simple process, increased production efficiency, reduces the production cost and it is suitable for industrial production.

DETAILED DESCRIPTION OF THE PREFERRED EMBODIMENTS

Figure 1:
FIG. 1 shows the schematic structure of the single-sided light emitting organic electroluminescent device in prior art.

Objects, embodiments and advantages of the present invention will be explained below in detail with reference to the accompanying drawings and embodiments. However, it should be appreciated that the following description of the embodiment is merely exemplary in nature and is not intended to limit this invention.

The emission principle of OLED is that under applied electric field, the electrons are injected from the cathode to the lowest unoccupied molecular orbital (LUMO) of the organic compound, meanwhile the holes are injected from the anode to the highest occupied molecular orbital (HOMO) of the organic compound. An electron and a hole meet with each other in the light emitting layer, then recombine to form an exciton, and the exciton migrates under the applied electric field, transferring energy to the light emitting material, then excite the electron to jump from the ground state to the excited state. The excited state electron loses energy and becomes enactive by radiation and emits a photon, releasing light energy. When the light is emitted to the substrate, the refraction and reflection of the light will occur at the interface between the substrate and/or the anode conjugated thereto, and the refracted light may cause loss of the light emitted by the organic electroluminescent device, and the reflected light may emit outside the organic electroluminescent device through the top side thereof, which may enhance the luminous efficiency of the organic electroluminescent device. Accordingly, the originally refracted light may be perfectly reflected after emitted to the interface by changing the characteristics of the refraction interface, thus the luminous efficiency of the organic electroluminescent device may be further improved.

According to the above mentioned principle, the embodiment of the present invention provides a double-sided light emitting organic electroluminescent device with small driving current, high brightness, high current efficiency, as shown in FIGS. 2 to 6. The double-sided light emitting organic electroluminescent device comprises a light-transmissive substrate 21, an anode 22, a light-transmissive cathode 25, at least two organic electroluminescent structures 23 and at least one charge generation layer 24. The arrangement relationship of the above components is: the charge generation layers 24 are separately disposed between two neighboring organic electroluminescent structures 23 and conjugated thereto, and the charge generation layers 24 and the organic electroluminescent structure 23 are alternatively arranged and integrated into a whole body; the surface of an organic electroluminescent structure 23a opposite to the charge generation layer 24 is combined with the anode 22 and the light-transmissive substrate 21 sequentially, the surface of another organic electroluminescent structures 23b opposite to the charge generation layer 24 is conjugated with the light-transmissive cathode 25. The charge generation layer 24 includes an N-type semiconductor layer 241 and a P-type semiconductor layer 242 combined with the N-type semiconductor layer 241.

Accordingly, the double-sided light emitting organic electroluminescent device has the configuration of a charge generation layer combined with two or more organic electroluminescent structures, this configuration allows the double-sided light emitting organic electroluminescent device to illuminate nearly 360 degrees omnidirectionally, enlarge the luminous area and extends the application field. The double-sided light emitting organic electroluminescent device of this configuration has small driving current, high luminous efficiency, high brightness, and high light output efficiency. Meanwhile, because of the small driving current, the lifetime of the double-sided light emitting organic electroluminescent device is significantly increased. The charge generation layer 24 according to the embodiments of the present invention has an N-type semiconductor layer 241 conjugated with a P-type semiconductor layer 242. Under an applied voltage, the electrons and the holes may be generated in the charge generation layer 24, and move to the external anode and light-transmissive cathode 25 respectively and they are injected into the organic electroluminescent structure 23, finally recombine with the holes and electrons generated in the external electrodes respectively to form excitons, and the light will be emitted by radiation attenuation in the light emitting layer. Accordingly, the charge generation layer 24 reduces the desired operating current of the double-sided light emitting organic electroluminescent device according to the embodiment of the present invention, endows the double-sided light emitting organic electroluminescent device with more emitting brightness, high current efficiency.

In particular, in the above-said charge generation layer 24, the N-type doped organic layer 241 preferably has a thickness of 10 to 30 nm, the P-type doped organic or metal oxide layer 242 preferably has a thickness of 3 to 30 nm.

The N-type semiconductor layer 241 is an N-type doped organic layer, the P-type semiconductor layer 241 is a P-type doped organic compound or metal oxide layer.

When the charge generation layer 24 is formed by combining an N-type doped organic layer 241 and a P-type doped organic layer 242, the material of the N-type doped organic layer 241 is preferably at least one selected from the group consisting of Li:Alq$_3$, Li:TPBi, Cs:Bphen, Mg:Alq$_3$, F$_{16}$CuPc, Cs$_2$CO$_3$:Alq$_3$, Li:Bphen, Cs:BCP and Li:BCP; the material of the P-type doped organic layer 242 is preferably at least one selected from the group consisting of FeCl$_3$:NPB, F4-TCNQ:NPB, F4-TCNQ:m-MTDATA, and CuPc.

When the charge generation layer 24 is formed by combining an N-type doped organic layer 241 and a metal oxide layer 242, the material of the N-type doped organic layer 241 is preferably at least one selected from the group consisting of Li:Alq$_3$, Li:TPBi, Cs:Bphen, Mg:Alq$_3$, F$_{16}$CuPc, Cs$_2$CO$_3$:Alq$_3$, Li:Bphen, Cs:BCP, and Li:BCP; and the material of the metal oxide layer 242 is preferably at least one selected from the group consisting of MoO$_3$, V$_2$O$_5$, WO$_3$, and nano indium tin oxide.

Accordingly, the structure of the charge generation layer 24 may be selected from the group consisting of Li:Alq$_3$/FeCl$_3$:NPB, Li:TPBi/FeCl$_3$:NPB, Cs:Bphen/F4-TCNQ:NPB, Mg:Alq$_3$/F4-TCNQ:m-MTDATA, F$_{16}$CuPc/CuPc, Cs$_2$CO$_3$:Alq$_3$/MoO$_3$, Li:Bphen/MoO$_3$, Cs:BCP/ITO, Li:BCP/V$_2$O$_5$, Mg:Alq$_3$/WO$_3$ and the like.

The above-mentioned material and the thickness of the charge generation layer 24 facilitates the generation of electrons and holes, and at the same time, it is also favorable to the transmission of light.

In particular, the material of the above-mentioned light-transmissive substrate 21 is preferably selected from the group consisting of a light-transmissive glass and a transparent polymer film material, and of course the material may be replaced with other materials commonly used in the art. The thickness of the light-transmissive substrate 21 can be that often used in this technical field, but it endows the substrate 21 with excellent light-transmissive property. According to measurement, the above preferred material may have a light transmittance up to 95%.

In particular, the anode 22 is preferably made of one selected from the group consisting of indium tin oxide (ITO), aluminum-doped zinc oxide (AZO), and indium-doped zinc oxide (IZO). Of course, the material thereof may alternatively be replaced by other materials commonly used in the field, such as fluorine-doped tin oxide (FTO). The thickness of the light-transmissive anode 22 may be that commonly used in this field, if only the thickness may endow the anode with good conductivity, so as to reduce the heat produced in the electrifying process of the anode 22, meanwhile the anode 22 should also have good light-transmissive property.

In particular, the material of the light-transmissive cathode 25 is preferably selected from the group consisting of gold (Au), silver (Ag), calcium (Ca), magnesium (Mg), aluminum (Al), magnesium-aluminum alloy and magnesium-silver alloy, the thickness of the light-transmissive cathode 25 may be that commonly used in this field, if only it may endow the cathode with good conductivity, so as to reduce its heat during the electrifying process, meanwhile the cathode should have good light-transmissive property. The light-transmissive cathode 25 preferably has a structure of Al/Ag double-layer, wherein the preferred thickness of the Al layer is 0.5 nm, the preferred thickness of the Ag layer is 20 nm.

Figure 2:
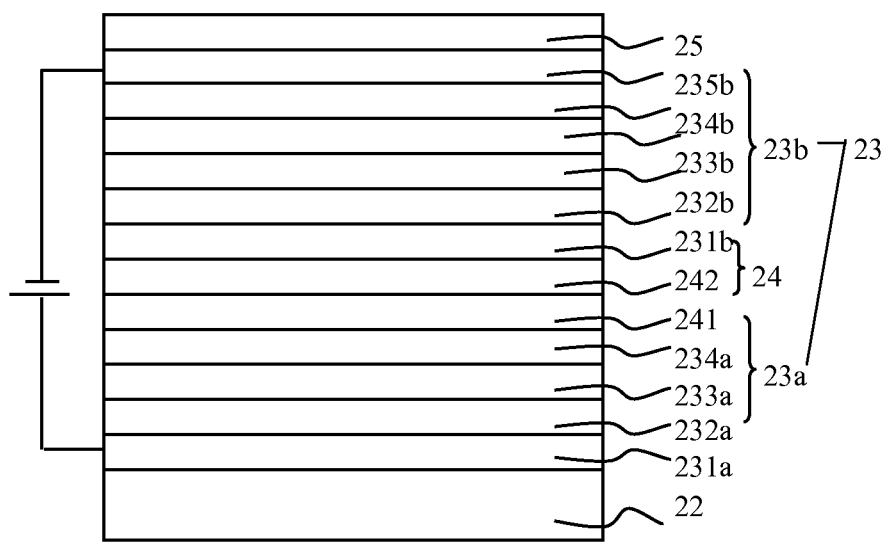
FIG. 2 shows the first schematic structure of the double-sided light emitting organic electroluminescent device according to the embodiment of the present invention.

In particular, the organic electroluminescent structure 23 includes a light emitting layer 233, and/or at least one selected from the group consisting of a hole injection layer 231, a hole transport layer 232, an electron transport layer 234, and an electron injection layer 235. Wherein the light emitting layer 233 may be made of red, yellow, blue, green color materials. When there are a plurality of light emitting layers in the electroluminescent device, the light emitting materials may be the same or different, and when different light emitting materials are employed, the type of the light emitting materials may be adjusted to achieve white light emitting. When there are two organic electroluminescent structures 23, and one charge generation layer 24, as shown in FIG. 2, one side of the organic electroluminescent structure 23a is conjugated with the anode 22, the opposite side thereof is conjugated with the charge generation layer 24, wherein the organic electroluminescent structure 23a also has at least one selected from the group consisting of a hole injection layer 231a and a hole transport layer 232a arranged between the light emitting layer 233a and the anode 22, and there is also at least one selected from the group consisting of an electron transport layer 234a and an electron injection layer disposed between the light emitting layer 233a and N-type semiconductor layer 241 of the charge generation layer 24. The organic electroluminescent structure 23b is conjugated with the light-transmissive cathode 25 at one side, and conjugated with the charge production layer 24 at the opposite side. The organic electroluminescent structure 23b also has at least one selected from the group consisting of an electron transport layer 234b and an electron injection layer 235b disposed between the light emitting layer 233b and the light-transmissive cathode 25, and at least one selected from the group consisting of a hole injection layer 231b and a hole transport layer 232b arranged between the light emitting layer 233b and the P-type semiconductor layer 242 of the charge generation layer 24.

Figure 3:
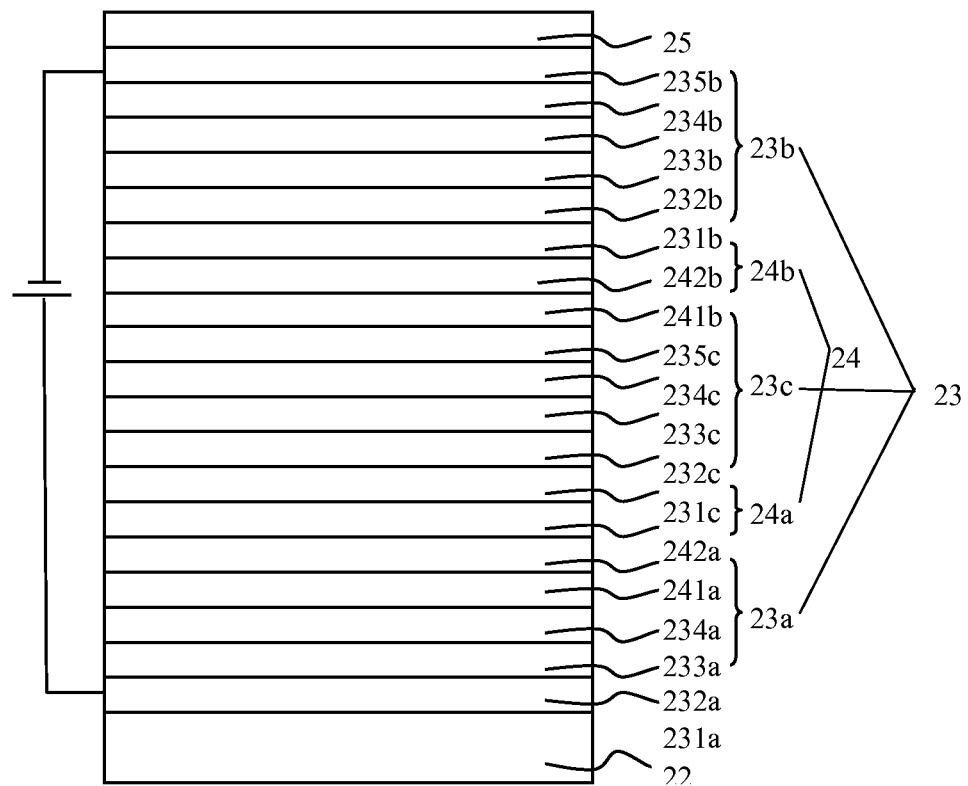
FIG. 3 shows the second schematic structure of the double-sided light emitting organic electroluminescent device according to the embodiment of the present invention.

When there are three organic electroluminescent structures 23, and two charge generation layers 24, as shown in FIG. 3, the organic electroluminescent structures 23 and the charge generation layers 24 are arranged alternatively and combined into a whole body, one organic electroluminescent structure 23a is conjugated with the anode at one side, and combined with the charge generation layer 24a at the opposite side, and another organic electroluminescent structure 23b at the other end is conjugated with the light-transmissive cathode 25 at one side, and combined with the charge generation layer 24b at the opposite side. The organic electroluminescent structures 23a and 23b include a light emitting layer 233, and/or at least one selected from the group consisting of a hole injection layer 231, a hole transport layer 232, an electron transport layer 234, an electron injection layer 235 respectively, and the combination manner of the hole injection layer 231, the hole transport layer 232, the electron transport layer 234, the electron injection layer 235 is similar to that of the above-mentioned configuration including two organic electroluminescent structures 23 and one charge generation layer 24. The third organic electroluminescent structure 23c is arranged between the charge generation layer 24a and the charge generation layer 24b and combined thereto, wherein at least one selected from the group consisting of a hole injection layer 231c and a hole transport layer 232 are sandwiched between the P-type semiconductor layer 242a of the charge generation layer 24a and the light emitting layer 233c of the organic electroluminescent structure 23c, and at least one selected from the group consisting of an electron transport layer 234c and an electron injection layer 235c are sandwiched between the N-type semiconductor layer 241b of the charge generation layer 24b and the light emitting layer 233c of the organic electroluminescent structure 23c. Wherein, compared with the P-type semiconductor layer, the N-type semiconductor layer of the charge generation layer is much closer to the anode, and the P-type semiconductor layer is adjacent to the light-transmissive cathode 25, that is, the orientations of the charge generation layer 24a and the charge generation layer 24b are identical in orientation when combined in the double-sided light emitting organic electroluminescent device of this embodiment.

Likewise, when there are three or more organic electroluminescent structures 23, and two or more charge generation layers 24, the organic electroluminescent structure 23 and the charge generation layer 24 are alternatively arranged and combined into a whole body. The configuration of the double-sided light emitting organic electroluminescent device is similar to that shown in FIG. 3, differing only in that the numbers of the alternatively arranged and combined organic electroluminescent structures 23 and charge generation layers 24 being increased or reduced. Accordingly, all changes which come within the meaning and range of equivalency of the present invention are intended to be embraced therein.

As described above, the configuration of the double-sided light emitting organic electroluminescent device according to the embodiments of the present invention may be, but not limited to, followings examples:

The first configuration: as shown in FIG. 2, the double-sided light emitting organic electroluminescent device according to this embodiment includes sequentially a light-transmissive substrate 21, an anode 22, a hole injection layer 231a, a hole transport layer 232a, a light emitting layer 233a, an electron transport layer 234a, an N-type semiconductor layer 241, a P-type semiconductor layer 242, a hole injection layer 231b, a hole transport layer 232b, a light emitting layer 233b, an electron transport layer 234b, an electron injection layer 235b, and a light-transmissive cathode 25, and they are combined into a whole body.

The second configuration: as shown in FIG. 3, the double-sided light emitting organic electroluminescent device according to this embodiment includes sequentially a light-transmissive substrate 21, an anode 22, a hole injection layer 231a, a hole transport layer 232a, a light emitting layer 233a, an electron transport layer 234a, an N-type semiconductor layer 241a, a P-type semiconductor layer 242a, a hole injection layer 231c, a hole transport layer 232c, a light emitting layer 233c, an electron transport layer 234c, an electron injection layer 235c, an N-type semiconductor layer 241b, a P-type semiconductor layer 242b, a hole injection layer 231b, a hole transport layer 232b, a light emitting layer 233b, an electron transport layer 234b, an electron injection layer 235b, a light-transmissive cathode 25, and they are combined into a whole body.

Figure 4:
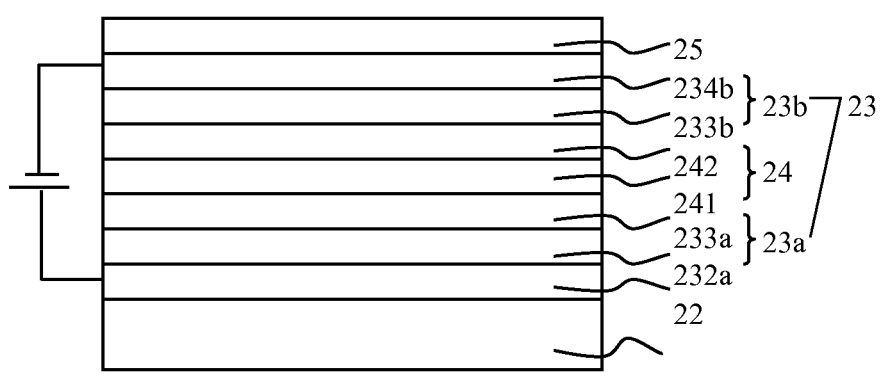
FIG. 4 shows the third schematic structure of the double-sided light emitting organic electroluminescent device according to the embodiment of the present invention.

The third configuration: as shown in FIG. 4, the double-sided light emitting organic electroluminescent device according to this embodiment includes sequentially a light-transmissive substrate 21, an anode 22, a hole transport layer 232a, a light emitting layer 233a, an N-type semiconductor layer 241, a P-type semiconductor layer 242, the light emitting layer 233b, the electron transport layer 234b, and a light-transmissive cathode 25, and they are combined into a whole body.

The above hole injection layer 231 preferably has a thickness of 20 to 80 nm, the material thereof is preferably a transition metal oxide, more preferably m-MTDATA, and other materials in this art may be used. The hole transport layer 232 preferably has a thickness of 20 to 80 nm, the material thereof is preferably at one selected from the group consisting of NPB, m-MTDATA, TPD, β-NPB, Spiro-NPB, DMF-NPB, α,β-NPB, spiro-TAD, DMF-TPD. The electron transport layer 234 preferably has a thickness of 20 to 80 nm, the material thereof is preferably one or more selected from the group consisting of Bphen, $Alq_3$, BCP, Galq, $BeBq_2$, Balq, TPBi, OXD-7, and TAZ. The electron injection layer 235 preferably has the thickness of 20 to 80 nm, the material thereof is preferably LiF, and of course, other materials in this art can also be used, such as, alkaline earth metal fluoride (NaF, CsF, $CaF_2$, $MgF_2$) or chloride (NaCl, KCl, RbCl).

The light emitting layer 233 preferably has a thickness of 20 to 80 nm, and the light emitting layer 233 may be made of red, yellow, blue, green luminescent materials and the like. When the number of the organic electroluminescent structures is two or more, the materials employed may be same or different, when there are different materials employed, the types of luminescent materials may be adjusted, so as to achieve white or other color light emitting. The light emitting layer 233 is preferably made of one or more selected from the group consisting of C545T:$Alq_3$, $(F-BT)_2Ir(acac)$:CBP, DPVBi, FIrPic:CBP, $Ir(ppy)_3$:CBP, and $Ir(piq)_3$:CBP. Other materials in the art of course can be used, such as dimethyl quinacridone (DMQA) and the like.

In the light emitting process of the organic electroluminescent device, the transmission rate of the holes and electrons are inconsistent, as a result the probability of the electron-hole recombination is low, and the brightness and efficiency of the organic electroluminescent device cannot be improved. Therefore, the employment of the hole injection layer 231, the hole transport layer 232, the light emitting layer 233, the electron transport layer 234, the electron injection layer 235 may effectively regulate the injection and transport rates of the electrons and holes, balance the carriers, control the recombination area, so as to obtain a desired luminous brightness and luminous efficiency, meanwhile, the organic electroluminescent device of this embodiment can not only ensure that the organic electroluminescent structure have a good adhesion with the charge generation layer 24, the anode 22 and the light-transmissive cathode 25 respectively, but also make sure that the carriers from the anode 22 and the light-transmissive cathode 25 can be injected into the organic electroluminescent structure more easily. For example, the hole injection layer 231 is preferably made of a transition metal oxide, which may match with the energy level of the organic hole transport layer 232, thus the hole injection to the anode 22 may be significantly strengthened, and the injection and the transmission rate of the electrons and holes may be effectively regulated, so as to balance the carriers and control the recombination area, such that the double-sided light emitting organic electroluminescent device according to the embodiment of the present invention may obtain a desired luminous brightness and luminous efficiency.

Figure 5:
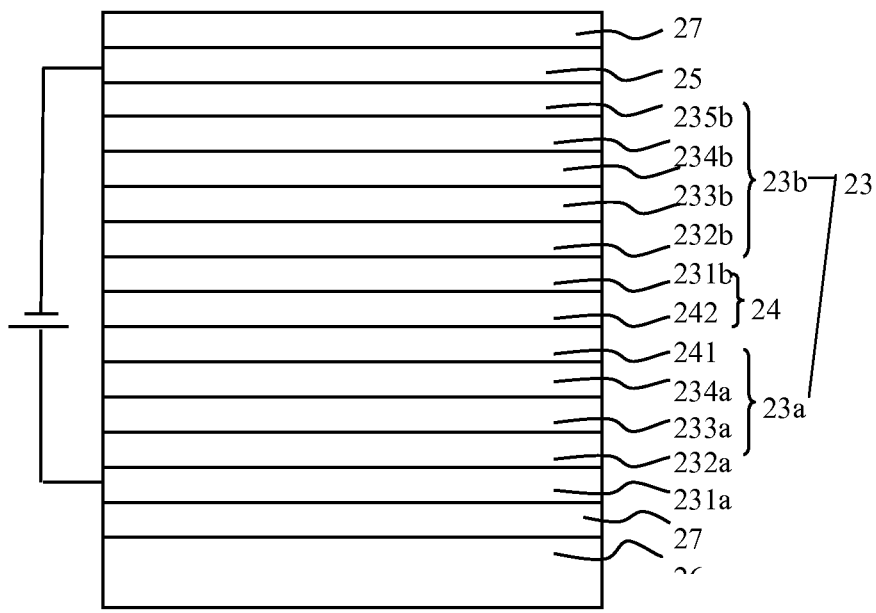
FIG. 5 shows the fourth schematic structure of the double-sided light emitting organic electroluminescent device according to the embodiment of the present invention.

Furthermore, in the double-sided light emitting organic electroluminescent device according to the embodiment of the present invention, a vapor barrier layer 26 may be provided between the anode 22 and the light-transmissive substrate 21, as shown in FIG. 5. The function of the vapor barrier layer 26 is to prevent atmospheric moisture from penetrating into the double-sided light emitting organic electroluminescent device in use, the penetration of moisture may affect the efficiency of the double-sided light emitting organic electroluminescent device. The vapor barrier layer 26 preferably has a thickness of 50 to 200 nm, the material thereof is preferably at least one selected from the group consisting of $SiN_x$, $SiO_2$, $Si_3N_4$, $Al_2O_3$, and $Ta_2O_5$. The vapor barrier layer 26 with this kind of material and this thickness may prevent the penetration of vapor more effectively, meanwhile the layer 26 has a good light-transmissive performance. For example, the vapor barrier layer 26 of $SiN_x$ is dense, has good light-transmissive property, and may effectively isolate the vapor. How to arrange the vapor barrier layer 26 may depend on the material type of the light-transmissive substrate 21, for example, when the light-transmissive substrate 21 is made of transparent polymer film material, it is preferred to arrange a vapor barrier layer 26 on one surface of the light-transmissive substrate 21 of transparent polymer film material. Of course, when the light-transmissive substrate 21 is made of transparent polymer film material, a vapor barrier layer 26 may be also further disposed.

Furthermore, in the double-sided light emitting organic electroluminescent device according to the embodiment of the present invention, an antireflection film layer 27 is adhered to the surface of the light-transmissive cathode 25 opposite to the organic electroluminescent structure 23, as shown in FIG. 5. Since the light transmittance of the metal light-transmissive cathode 25 is lower than that of the light-transmissive substrate, the arrangement of the antireflection film layer 27 may further enhance the light transmittance of the light-transmissive cathode 25, and improve the light output efficiency of light-transmissive cathode 25. The antireflection film 26 preferably has a thickness of 40 to 100 nm, the material thereof is preferably at least one selected from the group consisting of $Alq_3$, ZnSe, $TeO_2$, $MoO_x$, BCP, m-MTDATA, and ZnS. According to measurement, the light transmittance of the light-transmissive cathode 25 of the double-sided light emitting organic electroluminescent device according to the embodiment of the present invention has been increased by 8 to 10% by means of additionally providing an antireflection film layer 27.

Figure 6:
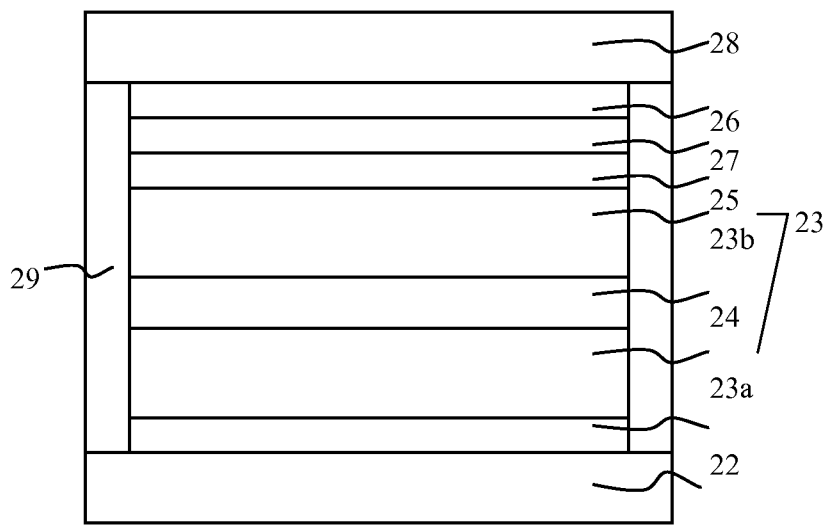
FIG. 6 shows the schematic structure of the double-sided light emitting organic electroluminescent device according to the embodiment of the present invention after packaging.

A transparent cover layer 28 may also be arranged on the outer surface of the antireflection film layer 27 or directly on the outer surface of the light-transmissive cathode 25, the function of the transparent cover layer 28 is to further prevent the oxidation of the light-transmissive cathode 25. In order to prevent vapor permeating from the side of the light-transmissive cathode 25 to the double-sided light emitting organic electroluminescent device according to the embodiment of the present invention, the vapor barrier layer 26 above-mentioned may be arranged between the antireflection film layer 27 (or the light-transmissive cathode 25) and the transparent cover layer 28, as shown in FIG. 6.

Furthermore, in order to protect the structure of each layer in the double-sided light emitting organic electroluminescent device of layers according to the embodiment of the present invention, as well as to ensure the luminous intensity and luminous efficiency of the organic electroluminescent device, a layer of transparent adhesive 29 may be packaged between the light-transmissive substrate 21 and the transparent cover layer 28 as well as around 22, 23, 24, 25, or around 22, 23, 24, 25, 26, 27, the transparent packaging adhesive 29 can be made of ultraviolet-curable adhesive (UV adhesive), of course, it also may be replaced with other adhesive commonly used in this art. The configuration of the double-sided light emitting organic electroluminescent device packaged with a transparent packaging adhesive 29 of the present invention is shown in FIG. 6.

Figure 7:
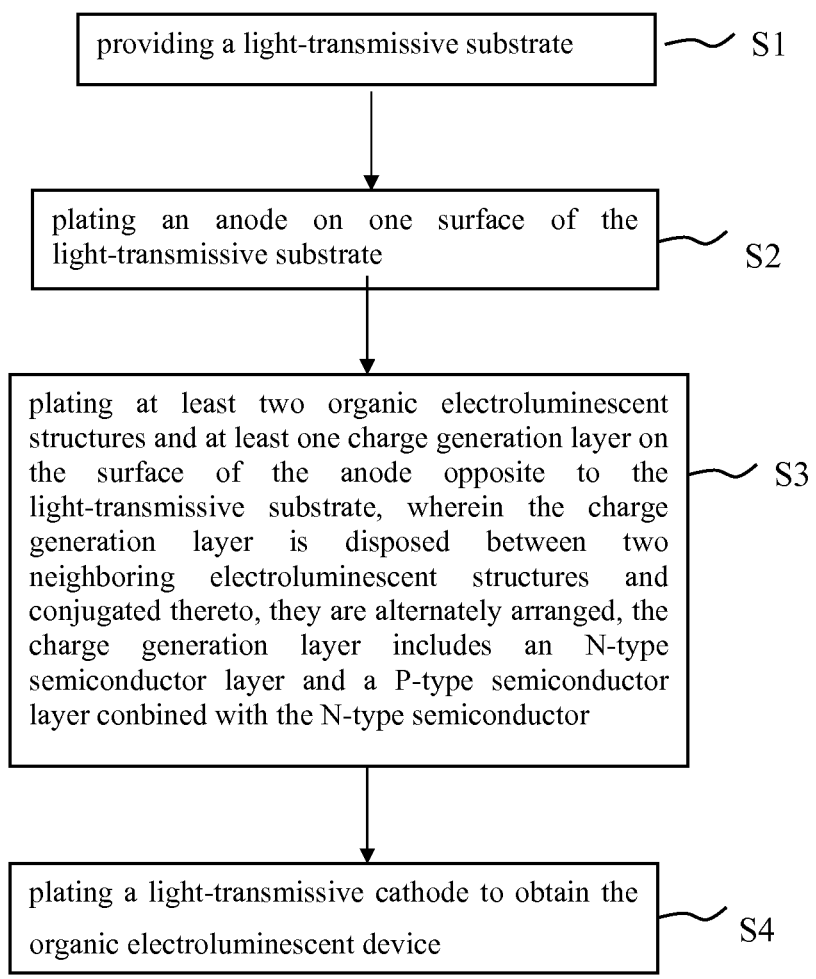
FIG. 7 shows the flow chart of the method for manufacturing the double-sided light emitting organic electroluminescent device according to the embodiment of the present invention.

According to the above-mentioned principle, the embodiments of the present invention provide a method for manufacturing the above-mentioned double-sided light emitting organic electroluminescent device, the flow chat of the process thereof is shown in FIG. 7, referring to FIGS. 2 to 6 at the same time, the process comprises:

S1: providing a light-transmissive substrate 21;

S2: plating an anode 22 on one surface of the light-transmissive substrate 21;

S3: plating at least two organic electroluminescent structures 23 and at least one charge generation layer 24 on the surface of the anode 22 opposite to the light-transmissive substrate 21, wherein the charge generation layer 24 is arranged between the two adjacent organic electroluminescent structures 23 and conjugated thereto, and disposed alternately with the organic electroluminescent structure 23; the charge generation layer 24 includes an N-type semiconductor layer 241 and a P-type semiconductor layer 242 combined with the N-type semiconductor layer 241;

S4: plating a light-transmissive cathode 25 at last, to obtain a double-sided light emitting organic electroluminescent device.

In the above-mentioned process of manufacturing the double-sided light emitting organic electroluminescent device, the operating process is only to plate each layer, and the preparation process is simple, and may improve production efficiency, reduce production cost, suitable for industrial production.

In particular, in step S1 of the manufacture method of the double-sided light emitting organic electroluminescent device, the configuration, material and specification of the light-transmissive substrate 21 are as described above, which will not be detailed again.

In step S2 of the manufacture method of the double-sided light emitting organic electroluminescent device, the manner of plating anode 2 is preferably selected from the group consisting of evaporation, sputtering and spray plating. Wherein the sputtering may be magnetron sputtering. The material and plating thickness of the anode 2 has been described, which will not be detailed again. Before the following step of evaporation, a pre-treatment is necessary for the anode 22, which includes cleaning, oxygen plasma treatment and the like. Wherein the preferred manner of cleaning is to wash in detergent, deionized water, acetone, ethanol, isopropanol sequentially under ultrasonic, each for 15 min, to completely remove the impurity on the surface of the anode 22 so that the surface of the anode 22 has the maximum degree of cleaning; after cleaning the anode 22 is treated with oxygen plasma, the duration thereof is preferably 5-15 min, the power thereof is preferably 10-150 W, and the main function of this treatment is to reduce the roughness and the contact angle on the surface of the conductive glass, so as to improve the wettability and adsorption of the surface, meanwhile the organic pollutants on the surface may be further removed by surface treatment.

In the step S3 of the manufacture method of the double-sided light emitting organic electroluminescent device, the manner of plating the organic electroluminescent structure 23 and the charge generation layer 24 is preferably selected from the group consisting of evaporation, sputtering, spray plating and chemical deposition. When the organic electroluminescent structure 23 sequentially contains a hole injection layer 231, a hole transport layer 232, a light emitting layer 233, an electron transport layer 234 and an electron injection layer 235, the hole injection layer 231, hole transport layer 232, light emitting layer 233, electron transport layer 234 and electron injection layer 235 are sequentially plated on the anode 2 by means of evaporation, sputtering, spray plating or chemical deposition. The figurations of organic electroluminescent structure 23 and the charge generation layer 24 have been described above, which will not be detailed here.

In the step S4 of the manufacture method of the double-sided light emitting organic electroluminescent device, the manner of plating light-transmissive cathode 25 is the same as that of plating the organic light emitting structure 23, alternatively, the manner of plating the anode 22 may be employed. The thickness and material of the light-transmissive cathode 25 are as described above.

The method for manufacturing the double-sided light emitting organic electroluminescent device may be carried out by simply plating each layer sequentially on the light-transmissive substrate 21, thus obtain the final product, and this method has simple process, increased production efficiency, reduced production cost and it is suitable for industrial production.

Furthermore, following the step S1 and prior to the step S2 of the manufacture method of the double-sided light emitting organic electroluminescent device, a vapor barrier layer 26 may be plated on one surface of the light-transmissive substrate 21.

Furthermore, after the step S4 of the manufacture method of the double-sided light emitting organic electroluminescent device, an antireflection film layer 27 may be plated on the outer surface of the light-transmissive cathode 25.

The thickness, material and function of the vapor barrier layer 26, the antireflection film layer 27 have been described above, and will not be repeated again. Wherein the plating of vapor barrier layer 26 is preferably carried out under an $N_2$ atmosphere. For example, when plating the vapor barrier layer 26 of $SiN_x$, under an $N_2$ environment, by employing a high-purity Si target, the vapor barrier layer 26 of $SiN_x$ is plated on one surface of the light-transmissive substrate 21 in a magnetron sputtering system. Of course, the vapor barrier layer 26, the antireflection film layer 27 may be plated by means of other manners commonly used in this art such as evaporation, sputter plating, and the like.

The present invention will be explained in detail referring to following Examples.

Example 1

The configuration of the double-sided light emitting organic electroluminescent device of this Example is shown in FIGS. 2 and 6, the double-sided light emitting organic electroluminescent device sequentially comprised a light-transmissive substrate 21, an anode 22, a hole injection layer 231a, a hole transport layer 232a, a light emitting layer 233a, an electron transport layer 234a, an N-type doped organic layer 241, a P-type doped organic layer 242, a hole injection layer 231b, a hole transport layer 232b, a light emitting layer 233b, an electron transport layer 234b, an electron injection layer 235b, a light-transmissive cathode 25, an antireflection film layer 27, a vapor barrier layer 26 and a transparent cover layer 28, and they were combined together, electroluminescent device included a transparent packaging adhesive layer 29 packaged between the transparent substrate 21 and the transparent cover layer 28 and around the components of the anode 22 to the vapor barrier layer 2.

Wherein, the light-transmissive substrate 21 was a 200 nm thick transparent glass, the anode 22 was a 100 nm thick indium tin oxide (ITO) layer, the hole injection layer 231a was a 30 nm thick m-MTDATA layer, the hole transport layer 232a was a 50 nm thick NPB layer, the light emitting layer 233a was a 20 nm thick C545T:$Alq_3$ layer, the electron transport layer 234a was a 40 nm thick $Alq_3$ layer, the N-type doped organic layer 241 was a 20 nm thick Li:$Alq_3$ layer, the P-type doped organic layer 242 was a 5 nm thick $MoO_3$, the hole injection layer 231b was a 30 nm thick m-MTDATA layer, the hole transport layer 232a was a 50 nm thick NPB layer, the light emitting layer 233a was a 20 nm thick C545T:$Alq_3$ layer, the electron transport layer 234a is a 40 nm thick $Alq_3$ layer, the electron injection layer 235b was a 1 nm thick LiF layer, the light-transmissive cathode 25 was an Al/Ag layer, the Al layer had a thickness of 0.5 nm, the Ag layer had the thickness of 20 nm, the vapor barrier layer 26 was a 50 nm thick $SiN_x$, the antireflection film layer 27 is an 80 nm thick $Alq_3$, the transparent cover layer 28 was a transparent glass, and the packaging adhesive layer 29 was made of UV glue.

The preparation method thereof was as follows:

(1) a transparent glass was provided as a light-transmissive substrate 21, and a layer of ITO was sputter plated on one surface of the light-transmissive substrate 21 to obtain an anode 22; the anode 22 was washed sequentially with a detergent, deionized water, acetone, ethanol, isopropanol under ultrasonic, each for 15 min;

(2) in the coating system with a vacuum degree of $5\times10^{-4}$ Pa, the hole injection layer 231a, the hole transport layer 232a, the light emitting layer 233a, the electron transport layer 234a, the N-type doped organic layer 241, the P-type doped organic layer 242, the hole injection layer 231b, the hole transport layer 232b, the light emitting layer 233b, the electron transport layer 234b, the electron injection layer 235b, the light-transmissive cathode 25 were plated sequentially by evaporation;

(3) the light-transmissive cathode 25 and the antireflection film 27 were sputter plated sequentially on the outer surface of the electron injection layer 235b;

(4) under the atmosphere of $N_2$, by employing a magnetron sputtering system, an $SiN_x$ layer of 50 nm was sputter plated on one surface of the antireflection film layer 27 to give a vapor barrier layer 26;

(5) a transparent glass layer 28 was additionally arranged on the outer surface of the vapor barrier layer 26;

(6) a transparent packaging adhesive layer 29 was packaged between the light-transmissive substrate 21 and the transparent cover layer 28, and around the components of the anode 22 to the vapor barrier layer 26, to obtain the double-sided light emitting organic electroluminescent device as shown in FIG. 6.

Figure 8:
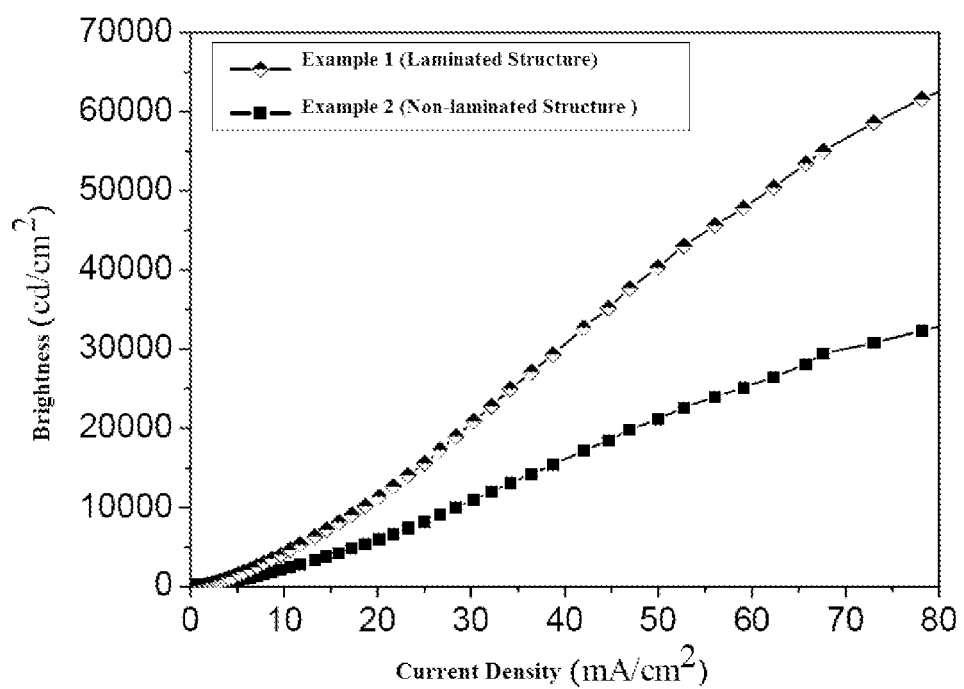
FIG. 8 shows the relational graphs of the brightness and the current density of the double-sided light emitting organic electroluminescent device prepared in Example 1 of the present invention and the organic electroluminescent device without a charge generation layer prepared in the Comparative Example 5.

In the double-sided light emitting organic electroluminescent device prepared in this Example, the C545T:$Alq_3$ doped structure was used as the green light emitting layer, the laminated Li:$Alq_3$/$MoO_3$ structure was used as a charge generation layer 24, and the $Alq_3$ film was used as the antireflection film. The relationship of the brightness and the current density of the double-sided light emitting organic electroluminescent device may be seen in FIG. 8. As shown in FIG. 8, compared with the organic electroluminescent device without the charge generation layer 24 of Comparative Example 5, with the same current density, the brightness of the double-sided light emitting organic electroluminescent device prepared in this Example has been significantly improved, which increases by about 1.9 times. Also, it can be seen that the double-sided light emitting organic electroluminescent device prepared in this Example has a small drive current, and high luminous efficiency, high brightness, and high light output efficiency; and because of the small drive current the lifetime of the double-sided light emitting organic electroluminescent device is improved correspondingly.

Example 2

The configuration of the double-sided light emitting organic electroluminescent device of this Example is similar to that of Example 1, which is shown in FIG. 6.

The preparation method of the organic electroluminescent device was as follows:

(1) a PET film was provided, then it was treated by washing;

(2) under the atmosphere of $N_2$, with a magnetron sputtering system, an $SiN_x$ layer of 50 nm thickness was sputter coated on one surface of the transparent substrate 21 to give a vapor barrier layer 26;

(3) an AZO layer of 150 nm thickness was sputter coated on the outer surface of the vapor barrier layer 26 to give an anode 22, then the anode 22 was treated by washing, the manner of cleaning was the same as that of step (1) of the manufacturing method of Example 1;

(4) in a coating system of $4\times10^{-4}$ Pa vacuum degree, an m-MTDATA layer 231a of 30 nm thickness, an NPB layer 232a of 50 nm thickness, a DPVBi layer 233a of 30 nm thickness, a Bphen layer 234a of 20 nm thickness, an $Alq_3$ layer 235a of 20 nm, a $Mg:Alq_3$ layer 241 of 30 nm thickness, an $MoO_3$ layer 242 of 3 nm thickness, an m-MTDATA layer 231b of 30 nm thickness, an NPB layer 232b of 50 nm thickness, an $(F-BT)_2Ir(acac):CBP$ layer 233b of 30 nm thickness, a Bphen layer 234b of 20 nm thickness, and an LiF layer 235b of 1 nm thickness were sequentially arranged by evaporation;

(5) an Al layer of 0.5 nm and an Ag layer of 20 nm thickness were sequentially evaporated on the outer surface of the electron injection layer 235b to give a light-transmissive cathode 25, and BCP antireflection film layer 27 of 100 nm thickness;

(6) under the atmosphere of $N_2$, with a magnetron sputtering system, an $SiN_x$ layer of 50 nm thickness was sputter coated on the antireflection film layer 27 to give another vapor barrier layer 26;

(7) a PET film layer 28 was additionally disposed on the outer surface of the vapor barrier layer 26;

(8) a transparent packaging adhesive layer 29 was packaged between the light-transmissive substrate 21 and the transparent cover layer 28, and around the components of the anode 22 to another vapor barrier layer 26, to obtain a double-sided light emitting organic electroluminescent device.

In the double-sided light emitting organic electroluminescent device prepared in this Example, the $(F-BT)_2Ir(acac):CBP$ doped structure was used as the yellow light emitting layer, the DPVBi was used as the blue light emitting layer, the $Mg:Alq_3/MoO_3$ laminated structure was used as the charge generation layer. According to the measurement, the relationship of the brightness and the current density of the double-sided light emitting organic electroluminescent device had a similar trend with that show in FIG. 7.

Example 3

The configuration of the double-sided light emitting organic electroluminescent device of this Example is shown in FIG. 2. The double-sided light emitting organic electroluminescent device sequentially comprised a light-transmissive substrate 21, an anode 22, a hole injection layer 231a, a hole transport layer 232a, a light emitting layer 233a, an electron transport layer 234a, an N-type doped organic layer 241, a P-type doped organic layer 242, a hole injection layer 231b, a hole transport layer 232b, a light emitting layer 233b, an electron transport layer 234b, an electron injection layer 235b, and a light-transmissive cathode 25, and they were combined together.

Wherein, the light-transmissive substrate 21 was a transparent glass of 200 nm thickness, the anode 22 was an IZO layer of 150 nm thickness, the hole injection layer 231a was an m-MTDATA layer of 30 nm thickness, the hole transport layer 232a was an NPB layer of 50 nm thickness, the light emitting layer 233a was a DPVBi layer of 20 nm thickness, the electron transport layer 234a was an $Alq_3$ layer of 40 nm thickness, the N-type doped organic layer 241 was a Cs:Bphen layer of 25 nm thickness, the P-type doped organic layer 242 was a $WO_3$ layer of 10 nm thickness, the hole injection layer 231b was an m-MTDATA layer of 30 nm thickness, the hole transport layer 232b was an NPB layer of 50 nm thickness, the light emitting layer 233b was a $Rubrene:Alq_3$ layer of 20 nm thickness, the electron transport layer 234b was an $Alq_3$ layer of 40 nm thickness, the electron injection layer 235b was an LiF layer of 1 nm thickness, the light-transmissive cathode 25 was a Ca layer of 20 nm thickness.

The preparation method of the organic electroluminescent device was as follows:

(1) a transparent glass was provided, and it was treated by washing;

(2) an IZO layer of 150 nm thickness was sputter coated on the outer surface of the vapor barrier layer 26 to give an anode 22, then it was treated by washing, the manner of washing was the same as the step (1) in the manufacturing method of Example 1;

(3) in the coating system with a vacuum degree of $4\times10^{-4}$ Pa, the m-MTDATA layer 231a of 30 nm thickness, the NPB layer 232a of 50 nm thickness, the DPVBi layer 233a of 20 nm thickness, the $Alq_3$ layer 234a of 40 nm thickness, the Cs:Bphen layer 241 of 25 nm thickness, the $WO_3$ layer 242 of 10 nm thickness, the m-MTDATA layer 231b of 30 nm thickness, the NPB layer 232b of 50 nm thickness, the $Rubrene:Alq_3$ layer 233b of 30 nm thickness, the $Alq_3$ layer 234b of 40 nm thickness, the LIF layer 235b of 1 nm thickness;

(4) an Al layer of 0.5 nm thickness and an Ag layer of 20 nm thickness were evaporated sequentially on the outer surface of the electron injection layer 235b to give a light-transmissive cathode 25 and the antireflection film layer 27 respectively;

(5) an $SiO2$ layer of 50 nm thickness was additionally evaporated on the outer surface of the antireflection film layer 27 to give another vapor barrier layer 26;

(6) a transparent glass cover plate 28 was additionally arranged on the outer surface of the vapor barrier layer 26;

(7) a transparent packaging adhesive layer 29 was packaged between the light-transmissive substrate 21 and the transparent cover layer 28, and around the components of the anode 22 to the vapor barrier layer 26, to obtain the double-sided light emitting organic electroluminescent device.

In the double-sided light emitting organic electroluminescent device prepared in this Example, the $Rubrene:Alq_3$ doped structure was used as the yellow light emitting layer, the DPVBi was used as a blue light emitting layer, and the $Cs:Bphen/WO_3$ laminated structure was used as the electron generation layer. According to the measurement, the relationship of the brightness and the current density of the double-sided light emitting organic electroluminescent device is similar with that shown in FIG. 8.

Example 4

The configuration of the double-sided light emitting organic electroluminescent device of this Example is shown in FIGS. 3 and 6. The double-sided light emitting organic electroluminescent device included sequentially a transparent substrate 21, an anode 22, a hole injection layer 231a, a hole transport layer 232a, a light emitting layer 233a, the electron transport layer 234a, an N-type doped organic layer 241a, a P-type doped organic layer 242a, a hole injection layer 231c, a hole transport layer 232c, a light emitting layer 233c, an electron transport layer 234c, an electron injection layer 235c, an N-type doped organic layer 241b, a metal oxides 242b, a hole injection layer 231b, a hole transport layer 232b, a light emitting layer 233b, an electron transport layer 234b, an electron injection layer 235b, a light-transmissive cathode 25, an antireflection coating layer 27, a vapor barrier layer 26 and a transparent cover layer 28, they were combined together, the electroluminescent device further included a transparent packaging adhesive layer 29 packaged between the light-transmissive substrate 21 and the transparent cover layer 28, around the components of the anode 22 to the vapor barrier layer 26.

The preparation methods of the organic electroluminescent device was as follows:

(1) a transparent glass was provided, and it was treated by washing, the process thereof was the same as step (1) in the manufacture method of Example 1;

(2) in the atmosphere of $N_2$, with a magnetron sputtering system, an $SiN_x$ layer of 50 nm thickness was sputter coated on one surface of the transparent substrate 21 to give a vapor barrier layer 26;

(3) an ITO layer of 150 nm thickness was sputter coated on the outer surface of the vapor barrier layer 26 to give an anode 22;

(4) in a coating system with a vacuum degree of $3 \times 10^{-4}$ Pa, an m-MTDATA layer 231a of 30 nm thickness, an NPB layer 232a of 50 nm thickness, an FIrPic:CBP 233a of 20 nm thickness, a TPBi layer 234a of 20 nm thickness, an Li:Alq$_3$ layer 241 of 20 nm thickness, an FeCl$_3$:NPB layer 242 of 30 nm thickness, an m-MTDATA layer 231c of 40 nm thickness, an NPB layer 232c of 40 nm thickness, an Ir(ppy)$_3$:CBP layer 233c of 20 nm thickness, a TPBi layer 234c of 20 nm, an NaF235c of 1 nm, an Li:TPBi layer 241b of 10 nm thickness, a V$_2$O$_5$ layer 242b of 5 nm thickness, an m-MTDATA layer 231b of 40 nm thickness, an NPB layer 232b of 40 nm thickness, an Ir(piq)$_3$:CBP layer 233b of 20 nm thickness, a TPBi layer 234b of 20 nm thickness, and an LiF layer 235b of 1 nm thickness were plated by evaporation;

(5) an Al layer of 0.5 nm thickness and an Ag layer of 20 nm thickness were sputter coated sequentially on the outer surface of the electron injection layer 235b to obtain a light-transmissive cathode 25, and an m-MTDATA layer 27 of 40 nm thickness was also coated;

(6) under an atmosphere of $N_2$, with a magnetron sputtering system, an $SiN_x$ layer of 50 nm thickness was sputter coated on the surface of the antireflective film layer 27 to give another vapor barrier layer 26;

(7) a transparent glass layer 28 was additionally plated on the outer surface of the vapor barrier layer 26;

(8) a UV transparent packaging adhesive layer 29 was packaged between the light-transmissive substrate 21 and the transparent glass layer 28, and around the components of the anode 22 to another vapor barrier layer 26, to obtain the double-sided light emitting organic electroluminescent device.

The performance of this organic electroluminescent light emitting device of this Example is similar to that described in Example 1.

Comparative Example 5

The organic electroluminescent device of this comparative Example comprised sequentially a transparent glass 21, an ITO anode 22, an m-MTDATA hole injection layer of 30 nm thickness, an NPB hole transport layer of 50 nm thickness, a C545T:Alq$_3$ light emitting layer of 20 nm thickness, an Alq$_3$ electron transport layer of 40 nm thickness, an LiF electron injection layer of 1 nm thickness, a cathode of Al (0.5 nm)/Ag (20 nm), an Alq$_3$ antireflective film layer of 80 nm thickness, an $SiN_x$ vapor barrier layer of 50 nm thickness and a transparent cover layer of transparent glass, they were combined together, the electroluminescent device also comprised a UV transparent packaging adhesive layer 29 packaged between the transparent substrate and the transparent cover layer, around the components of the anode to the vapor barrier layer.

According to the measurement, the relationships of the luminous intensity and the current density of the double-sided light emitting organic electroluminescent devices of this comparative Example and that of Example 1 are shown in FIG. 8.

The description above is merely the preferable embodiments of the present invention and not intended to limit the present invention. And all changes, equivalent substitution and improvements which come within the meaning and range of equivalency of the present invention are intended to be embraced therein.

What is claimed is:

1. A double-sided light emitting organic electroluminescent device, which comprises a light-transmissive substrate, an anode, a light-transmissive cathode, wherein there are at least two organic electroluminescent structures and at least one light-transmissive charge generation layer arranged between the anode and the light-transmissive cathode;

the light-transmissive charge generation layer is arranged between the two neighboring organic electroluminescent structures and conjugated thereto, and the light-transmissive charge generation layer and the organic electroluminescent structure are alternatively arranged and combined together;

the light-transmissive charge generation layer comprises an N-type semiconductor layer and a P-type semiconductor layer directly connected to the N-type semiconductor layer, wherein the P-type semiconductor layer is a metal oxide layer.

2. The double-sided light emitting organic electroluminescent device of claim 1, wherein the N-type semiconductor layer has a thickness of 10-30 nm, the P-type semiconductor layer has a thickness of 3-30 nm.

3. The double-sided light emitting organic electroluminescent device of claim 2, wherein an antireflection film layer is conjugated on the outer surface of the light-transmissive cathode, the antireflection film layer has a thickness of 40 to 100 nm, and the material thereof is at least one selected from the group consisting of Alq$_3$, ZnSe, TeO$_2$, MoO$_x$, BCP, m-MTDATA, and ZnS.

4. The double-sided light emitting organic electroluminescent device of claim 1, wherein the N-type semiconductor layer is a N-type doped organic layer.

5. The double-sided light emitting organic electroluminescent device of claim 4, wherein the light-transmissive charge generation layer consists of N-type doped organic layer and metal oxide layer, and the N-type doped organic layer is made of at least one selected from the group consisting of Li:Alq$_3$, Li:TPBi, Cs:BPhen, Mg:Alq$_3$, F$_{16}$CuPc, Cs$_2$CO$_3$:Alq$_3$, Li:BPhen, Cs:BCP, and Li:BCP, and the metal oxide layer is made of at least one selected from the group consisting of MoO$_3$, V$_2$O$_5$, WO$_3$, and nano-Indium tin oxide.

6. The double-sided light emitting organic electroluminescent device of claim 5, wherein an antireflection film layer is conjugated on the outer surface of the light-transmissive cathode, the antireflection film layer has a thickness of 40 to 100 nm, and the material thereof is at least one selected from the group consisting of Alq$_3$, ZnSe, TeO$_2$, MoO$_x$, BCP, m-MTDATA, and ZnS.

7. The double-sided light emitting organic electroluminescent device of claim 4, wherein an antireflection film layer is conjugated on the outer surface of the light-transmissive cathode, the antireflection film layer has a thickness of 40 to 100 nm, and the material thereof is at least one selected from the group consisting of Alq$_3$, ZnSe, TeO$_2$, MoO$_x$, BCP, m-MTDATA, and ZnS.

8. The double-sided light emitting organic electroluminescent device of claim 1, wherein there are at least one selected from the group consisting of a hole injection layer and a hole transport layer sequentially disposed between the anode and the light emitting layer of the organic electroluminescent structure, at least one selected from the group consisting of an electron transport layer and an electron injection layer sequentially disposed between the light emitting layer of the organic electroluminescent structure and the N-type semiconductor layer of the light-transmissive charge generation layer, at least one selected from the group consisting of a hole injection layer and a hole transport layer sequentially arranged between the light emitting layer of the organic electroluminescent structure and the P-type semiconductor layer of the light-transmissive charge generation layer, and at least one selected from the group consisting of an electron transport layer and an electron injection layer sequentially arranged between the light emitting layer of the organic electroluminescent structure and the light-transmissive cathode.

9. The double-sided light emitting organic electroluminescent device of claim 8, wherein an antireflection film layer is conjugated on the outer surface of the light-transmissive cathode, the antireflection film layer has a thickness of 40 to 100 nm, and the material thereof is at least one selected from the group consisting of $Alq_3$, ZnSe, $TeO_2$, $MoO_x$, BCP, m-MTDATA, and ZnS.

10. The double-sided light emitting organic electroluminescent device of claim 1, wherein an antireflection film layer is conjugated on the outer surface of the light-transmissive cathode, the antireflection film layer has a thickness of 40 to 100 nm, and the material thereof is at least one selected from the group consisting of $Alg_3$, ZnSe, $TeO_2$, $MoO_x$, BCP, m-MTDATA, and ZnS.

11. The double-sided light emitting organic electroluminescent device of claim 10, wherein there is a vapor barrier layer arranged between the anode and the light-transmissive substrate and/or the outer surface of the light-transmissive cathode, the vapor barrier layer has a thickness of 50 to 200 nm, and the material thereof is at least one selected from the group consisting of $SiN_x$, $SiO_2$, $Si_3N_4$, $Al_2O_3$, and $Ta_2O_5$.

12. A method for manufacturing the double-sided light emitting organic electroluminescent device of claim 1, comprising:
providing a light-transmissive substrate;
plating an anode on one surface of the light-transmissive substrate;
plating at least two organic electroluminescent structures and at least one light-transmissive charge generation layer on the surface of the anode opposite to the light-transmissive substrate, wherein the light-transmissive charge generation layer is disposed between two neighboring organic electroluminescent structures and conjugated thereto, and the light-transmissive charge generation layer and the organic electroluminescent structure are alternately arranged, the light-transmissive charge generation layer comprises an N-type semiconductor layer and a P-type semiconductor layer directly connected to the N-type semiconductor layer, and the P-type semiconductor layer is a metal oxide layer,
plating a light-transmissive cathode finally to obtain the organic electroluminescent device.

13. The method for manufacturing the double-sided light emitting organic electroluminescent device of claim 12, wherein there is an antireflection film layer plated on the outer surface of the light-transmissive cathode.

14. The method for manufacturing the double-sided light emitting organic electroluminescent device of claim 12, wherein the method further comprises the step of plating a vapor barrier layer between the anode and the light-transmissive substrate and/or on the outer surface of the light-transmissive cathode.

* * * * *